(12) United States Patent
Jagannathan et al.

(10) Patent No.: US 8,653,610 B2
(45) Date of Patent: Feb. 18, 2014

(54) HIGH PERFORMANCE NON-PLANAR SEMICONDUCTOR DEVICES WITH METAL FILLED INTER-FIN GAPS

(75) Inventors: Hemanth Jagannathan, Albany, NY (US); Sivananda Kanakasabapathy, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 12/764,762

(22) Filed: Apr. 21, 2010

(65) Prior Publication Data

US 2011/0260257 A1  Oct. 27, 2011

(51) Int. Cl.
*H01L 29/76* (2006.01)
(52) U.S. Cl.
USPC ....... 257/411; 257/407; 257/412; 257/E29.13
(58) Field of Classification Search
USPC .......... 257/369, 407, 411, 412, 619, E29.028, 257/E29.13, E29.259, E29.267
See application file for complete search history.

(56) References Cited

U.S. PATENT DOCUMENTS

| | | | |
|---|---|---|---|
| 2006/0138552 A1* | 6/2006 | Brask et al. | 257/369 |
| 2007/0122953 A1* | 5/2007 | Liu et al. | 438/187 |
| 2011/0079829 A1* | 4/2011 | Lai et al. | 257/288 |
| 2011/0248348 A1* | 10/2011 | Gan et al. | 257/369 |

* cited by examiner

*Primary Examiner* — Matthew E Warren
(74) *Attorney, Agent, or Firm* — F. Chau & Associates, LLC; Louis J. Percello, Esq.

(57) ABSTRACT

A non-planar semiconductor transistor device includes a substrate layer. Conductive channels extend between corresponding source and drain electrodes. A gate stack extending in a direction perpendicular to the conductive channels crosses over the plurality of conductive channels. The gate stack includes a dielectric layer running along the substrate and the plurality of conductive channels and arranged with a substantially uniform layer thickness, a work-function electrode layer covers the dielectric layer and is arranged with a substantially uniform layer thickness, and a metal layer, distinct from the work-function electrode layer, covers the work-function electrode layer and is arranged with a substantially uniform height with respect to the substrate such that the metal layer fills a gap between proximate conductive channels of the plurality of conductive channels.

23 Claims, 6 Drawing Sheets

HIGH PERFORMANCE NON-PLANAR SEMICONDUCTOR DEVICES WITH METAL FILLED INTER-FIN GAPS

BACKGROUND OF THE INVENTION

1. Technical Field

The present disclosure relates to semiconductor devices and, more specifically, to high performance non-planar semiconductor devices with metal filled inter-fin gaps.

2. Discussion of Related Art

A field-effect transistor (FET) is a semiconductor device that utilizes an electric field to control a size and/or shape of a conductive channel and thereby influences electrical flow through the channel. FETs may be either n-channel (nFET) or p-channel (pFET). CMOS technology may be formed by pairing together nFETs and pFETs on the same wafer.

FETs may be multigated. A multigate FET (MuGFET) is a type of FET that has more than one gate within a single device. Examples of MuGFETs include the FinFET and the Tri-gate FET. A FinFET is a nonplanar, double-gate transistor in which the conducting channel is formed with a relatively thin and tall semiconductor "fin" which forms the body of the device. The tri-gate may be substantially similar in structure to the FinFET. Both multigate devices may also have multiple sources and multiple drains, with corresponding conducting channel fins formed there between.

Nonplanar multigate transistors such as FinFETs and tri-gates may provide enhanced performance over conventional transistors. However, in forming FinFETs, there is a tendency for key holes and voids to form within a silicon containing layer of the gate between the conducting channels as silicon is deposited thereon. These key holes and voids pose problems for performance and yield. Additionally, the existing approaches for stress enhancement in planar CMOS devices may be suboptimal in nonplanar multigate transistors.

SUMMARY

A non-planar semiconductor transistor device includes a substrate layer. A plurality of source and drain electrodes are located on the substrate layer. A plurality of corresponding conductive channels extends between corresponding source and drain electrodes. A gate stack is located on the substrate layer and crosses over the plurality of conductive channels. The gate stack extends in a direction perpendicular to the direction in which the conductive channels extend. The gate stack includes a dielectric layer running along the substrate and the plurality of conductive channels and arranged with a substantially uniform layer thickness, a work-function electrode layer covering the dielectric layer and arranged with a substantially uniform layer thickness, and a metal layer, distinct from the work-function electrode layer, covering the work-function electrode layer and arranged with a substantially uniform height with respect to the substrate such that the metal layer fills a gap between proximate conductive channels of the plurality of conductive channels.

Each conductive channel of the plurality of conductive channels may include a conductive layer adjacent to a hard mask layer on top of the fin-shaped conductive layer. The resulting non-planar semiconductor transistor device from such conductive layers may be a FinFET device. The work-function electrode layer and the metal layer may be formed of a different chemical composition or alloy. The work-function electrode layer may conform to the shape of the top surface of the channels. The metal layer may be planarized by a polishing process after deposition.

An interface layer may be located between the conductive channels and the gate dielectric. A barrier layer may be located between the metal layer and the work-function layer. The barrier layer may be used to getter the interface layer to reduce the distance between the work-function electrode and the conductive channel.

The metal layer may be formed to have an intrinsic state of compressive or tensile stress. The conductive channel may be formed of a semiconductor such as silicon, germanium, SiGe or SiC. The dielectric layer may be formed of a semiconductor oxide or high-K dielectric film having a high dielectric constant greater than 3.9. The dielectric layer may have a thickness of between approximately 1 nm and approximately 10 nm.

The work-function layer may be formed of a metal or another conductive material having a desired work function that permits a desired level of electron removal from the conductive channel, wherein the desired work function is within the range of 3.0 eV and 6.0 eV. The work-function layer may be formed of TaN, TiN, WN, TiAlN, TaCN, another conductive refractory metal nitride, or an alloy thereof.

The metal layer may be formed over the work-function layer by sputtering, physical vapor deposition, atomic layer deposition or chemical vapor deposition. The metal layer may include tungsten, tungsten nitride, or a tungsten aluminum alloy.

The thickness of the work-function layer may be between approximately 1 nm and 20 nm.

A CMOS technology includes a substrate layer, at least one p-type metal oxide semiconductor field-effect transistor, and at least one n-type metal oxide semiconductor field-effect transistor. Each of the p-type and n-type metal oxide semiconductor field-effect transistors include a plurality of source and drain electrodes on the substrate layer, with a plurality of corresponding conductive channels extending between corresponding source and drain electrodes, and a gate stack on the substrate layer, crossing over the plurality of conductive channels, the gate stack extending in a direction perpendicular to the direction in which the conductive channels extend. The gate stack includes a dielectric layer running along the substrate and the plurality of conductive channels and arranged with a substantially uniform layer thickness, a work-function electrode layer covering the dielectric layer and arranged with a substantially uniform layer thickness, and a metal layer, distinct from the work-function electrode layer, covering the work-function electrode layer and arranged with a substantially uniform height with respect to the substrate such that the metal layer fills a gap between proximate conductive channels of the plurality of conductive channels.

The metal layer of the one or more n-type metal oxide semiconductor field-effect transistors may be formed to have an intrinsic state of tensile stress and the metal layer of the one or more p-type metal oxide semiconductor field-effect transistors is formed to have a compressive state of tensile stress.

The metal layer of the one or more n-type metal oxide semiconductor field-effect transistors may be formed to have an intrinsic state of tensile or compressive stress and the metal layer of the one or more p-type metal oxide semiconductor field-effect transistors may be formed to have the same or opposite state of stress as the metal layer of the one or more n-type metal oxide semiconductor field-effect transistors.

The metal layer of the one or more n-type metal oxide semiconductor field-effect transistors and the one or more p-type metal oxide semiconductor field-effect transistors may include Tungsten or Tungsten Nitride.

A FinFET device includes a substrate layer, a source and drain electrode on the substrate layer, with a fin-shaped conductive channel extending between the source and drain electrodes, a dielectric layer running along the substrate and the conductive channel and arranged with a substantially uniform layer thickness, a work-function electrode layer covering the dielectric layer and arranged with a substantially uniform layer thickness, and a metal layer, distinct from the work-function electrode layer, covering the work-function electrode layer and arranged with a substantially uniform height with respect to the substrate. The metal layer has an intrinsic state of compressive or tensile stress.

The work-function electrode layer and the metal layer may be of a different chemical composition or alloy and the work-function electrode layer may conform to the shape of the top surface of the channel.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE DRAWINGS

Figure 1:
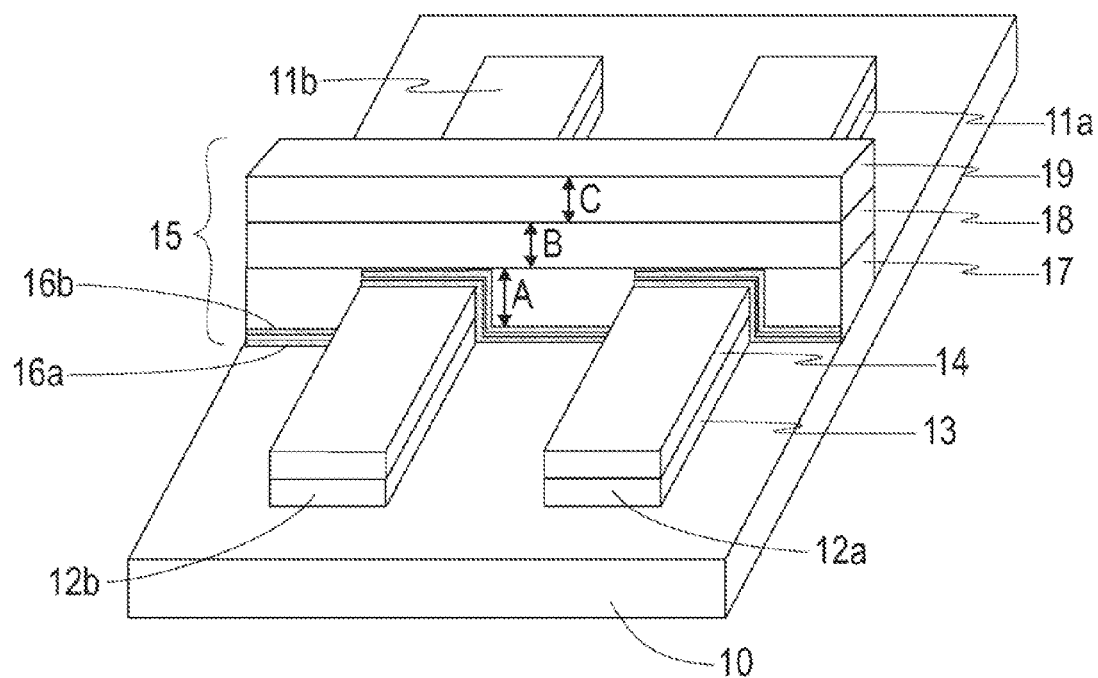
FIG. 1 is a perspective view illustrating a nonplanar multigate transistor according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Exemplary embodiments of the present invention seek to provide nonplanar multigate transistors such as FinFETS and tri-gates with an enhanced structure that may provide high density, high performance, and a reduced potential for the formation of key holes and voids within the transistor gates. Exemplary embodiments of the present invention may also provide effective and efficient stress enhancement that may enhance the performance of nFET and pFET-type FinFETs.

FIG. 1 is a perspective view illustrating a nonplanar multigate transistor according to an exemplary embodiment of the present invention. It is to be understood that the illustrated elements have been drawn to enhance clarity and accordingly, features may not be drawn to scale. Moreover, various elements and layers shown in direct proximity should be understood as teaching that these layers can be so formed, however, it should also be understood that intervening layers may be formed between the layers shown. The foundation of the transistor may be a semiconductor substrate 10. The substrate 10 may be comprised of, for example, silicon or an oxide. The substrate may be a silicon on insulator (SOI) wafer or a BULK silicon wafer. Thereon, a plurality of sources 11 and drains 12 may be formed. While any number of sources 11 and drains 12 may be formed on a single substrate 10, as illustrated, there are two sources 11A and 11B and a corresponding set of two drains 12A and 12B. A conductive channel 13 is formed between each source and each corresponding drain. The conductive channel may be formed, for example, of a semiconductor layer such as silicon, germanium, SiGe or SiC. The conductive channel 13 may be capped with a hard mask 14. The conductive channel may be a fin shaped pillar.

Gates 15 may be formed over the fin-shaped conductive channel 13 and the hard mask 14. The gates may be formed over multiple conductive channels 13. Unlike a single-gated transistor where there is only a single gate, exemplary embodiments of the present invention may have multiple gates, for example, a first gate that contacts the conductive channel from a first side and a second gate that contacts the conductive channel from an opposite side. However, both of these gates may be formed as a single structure. The gates 15 may include a relatively thin gate dielectric layer 16a and a work-function electrode layer 16b. The gate dielectric layer 16a may be formed of a semiconductor oxide or high-K dielectric film having a high dielectric constant greater than 3.9. The gate dielectric layer 16a may have a thickness of between approximately 1 nm and approximately 10 nm, for example, within a range of between approximately 1.5 nm and approximately 3 nm being more typical.

The work-function electrode layer 16b may be formed of a metal, or perhaps another conductive material, having a desired work function that may permit a desired level of electron removal from the fin-shaped conductive channel 13. The desired work function for this layer 16b may be for example, within the range of 3.0 and 6.0 eV. The material used may be a metal, a metal alloy, or a metal nitride such as TaN, TiN, WN, TiAlN, TaCN, other conductive refractory metal nitride, or an alloy thereof.

A metal gate layer 17 may be formed on top of the work-function metal layer 16b. The metal gate layer 17 may be deposited, for example, using a process such as sputtering, physical vapor deposition (PVD), atomic layer deposition (ALD), or chemical vapor deposition (CVD). Accordingly, the metal gate layer 17 may be formed over the work-function metal layer 16b using a bottom-up approach so that a uniform height is achieved over the entire metal gate layer 17. Examples of suitable bottom-up filling approaches include iPVD, GCIB, or a high throughput conformal process such as electroplating. Alternatively, atomic layer deposition processes may be used to form the metal gate layer 17.

Accordingly, the top surface of the metal gate layer 17 may be at an equal height relative to the substrate 10 regardless of its position with respect to the conductive channel 13. This attribute may be achieved with or without the use of planarization techniques such as polishing. This may stand in contrast to the work-function metal layer 16b which may be of a uniform thickness and therefore, its height relative to the substrate 10 is greater for locations over the conductive channel 13 than for locations where the work-function metal layer 16b is directly over the substrate.

The metal gate layer 17 may include, for example, tungsten, tungsten nitride, or a tungsten aluminum alloy. The metal gate layer 17 may be sufficiently high such that the work-function metal layer 16b is fully covered, even at its highest points over the conductive channel 13. This is to say, the volume between the fins of the conductive channels 13 is fully filled with the metal gate layer 17. Due to the properties of the metal gate layer 17 and the manner in which it is deposited, voids within the inter-fin region of the gate 15 may be significantly reduced or entirely avoided.

Moreover, the inter-fin region may be entirely filled by the work-function metal layer 16b and the metal gate layer 17 without the need for poly-silicon within the inter-fin region.

According to some exemplary embodiments of the present invention, the metal gate layer 17 may be stress engineered whereby it is formed to be in an intrinsic state of stress to provide a compressive state of stress or a tensile state of stress to the conductive channel 13 which it surrounds. For example, for nFET, the metal gate layer 17 may optionally have a Pillings-Bedworth (PB) ratio that may allow for a net volumetric expansion upon anneal to cast a compressive stress on the fin in a direction perpendicular to the conductive channel 13. For pFET, the metal gate layer 17 may optionally have a PB ratio that may allow for a net volumetric compression upon anneal to cast a tensile stress on the fin in the direction perpendicular to the conductive channel 13. Accordingly, for CMOS including both an n-type FinFET and a p-type Fin-FET, both techniques may be incorporated into multiple devices on the same wafer.

Figure 6:
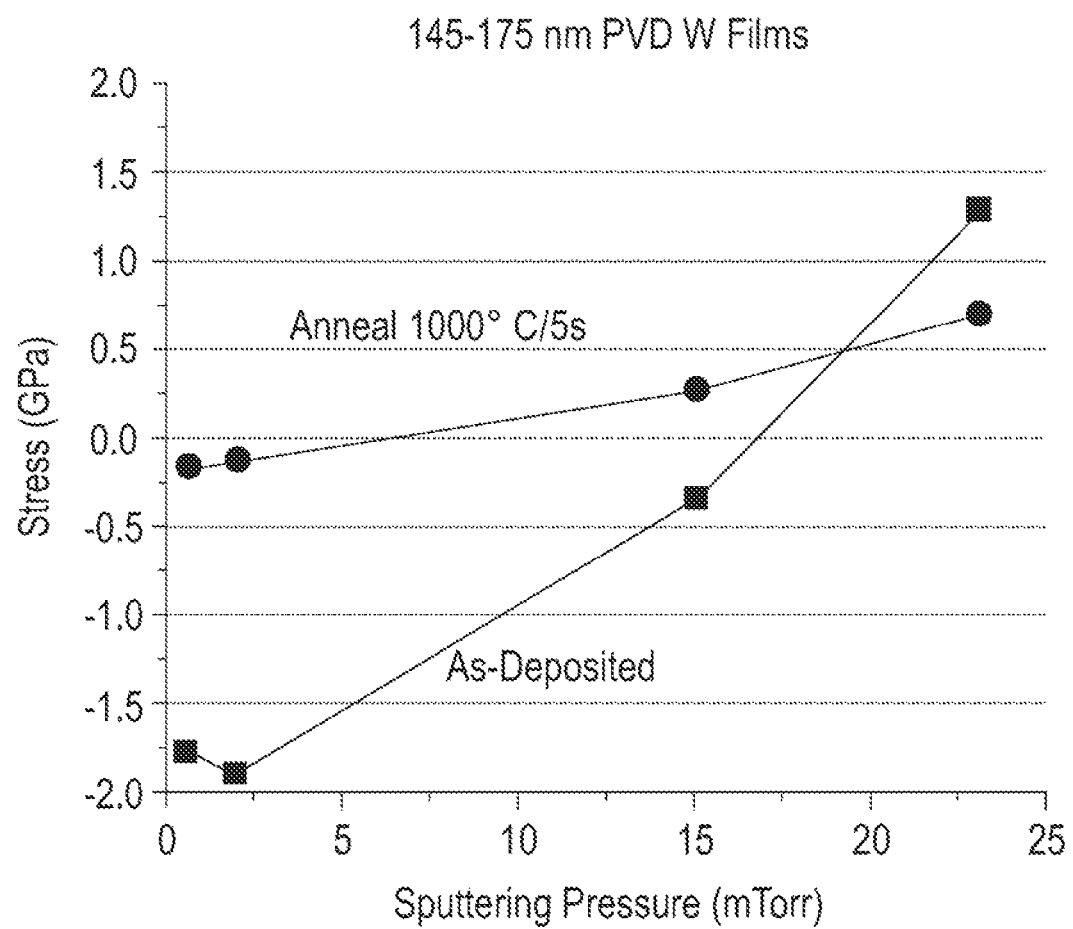
FIG. 6 is a graph illustrating stress engineering characteristics for a Tungsten metal layer according to exemplary embodiments of the present invention.

According to an exemplary embodiment of the present invention, the metal gate layer 17 may include a Tungsten (W) film where stress engineering for such a metal layer may be performed, for example, as illustrated in the graph of FIG. 6. In addition, stress engineering may be performed where the metal gate layer is deposited with an intrinsic compressive or tensile stress over both n-type and p-type FETs and is subsequently de-stressed on a select n-type or p-type devices.

The metal gate layer 17 may for example include a stack of distinct metal layers. Here, each of the distinct metal layers may be formed of one or more different substances and/or may be differently deposited. The distinct metal layers may, for example, may include a common fill metal. Alternatively, or additionally, block masks and selective etching may be used to fill the distinct metal layers with polarity specific metals.

According to an exemplary embodiment of the present invention, the work-function metal layer 16b may be patterned in substantially the same processing step as the metal gate layer 17 so as to etch both layers isotropically along the fin gate and sidewall.

On top of the metal gate layer 17, a poly-silicon layer 18 may be formed. Alternatively, or additionally, layer 18 may include amorphous silicon. The poly-silicon layer 18 may be capped with a hard mask layer 19 to complete the gate 15.

The work-function metal layer 16b may have a uniform thickness of approximately less than 1 nm to 20 nm with 2 nm to 5 nm being more typical. The metal gate layer 17 may have a thickness, at its thinnest point which would be located over the hard mask of the fin-shaped conductive channel 13, of approximately less than 1 nm to 50 nm with 10 nm to 30 nm being more typical. The metal gate layer 17 may have a thickness "A" at its thickest point, which would be located in the inter-fin region, which is equal to the thickness of the metal gate layer 17 at its thinnest point plus the thickness of the conductive channel 13 and its hard mask 14. The poly-silicon layer 18 may have a uniform thickness "B" of from 0 nm to 50 nm, as the use of this layer may be optionally omitted according to exemplary embodiments of the present invention. The hard mask layer 19 may have a uniform thickness "C" of from 0 nm to 50 nm. Where the poly-silicon layer 18 is omitted, the hard mask layer 19 may be formed directly on the metal gate layer.

Figure 2:
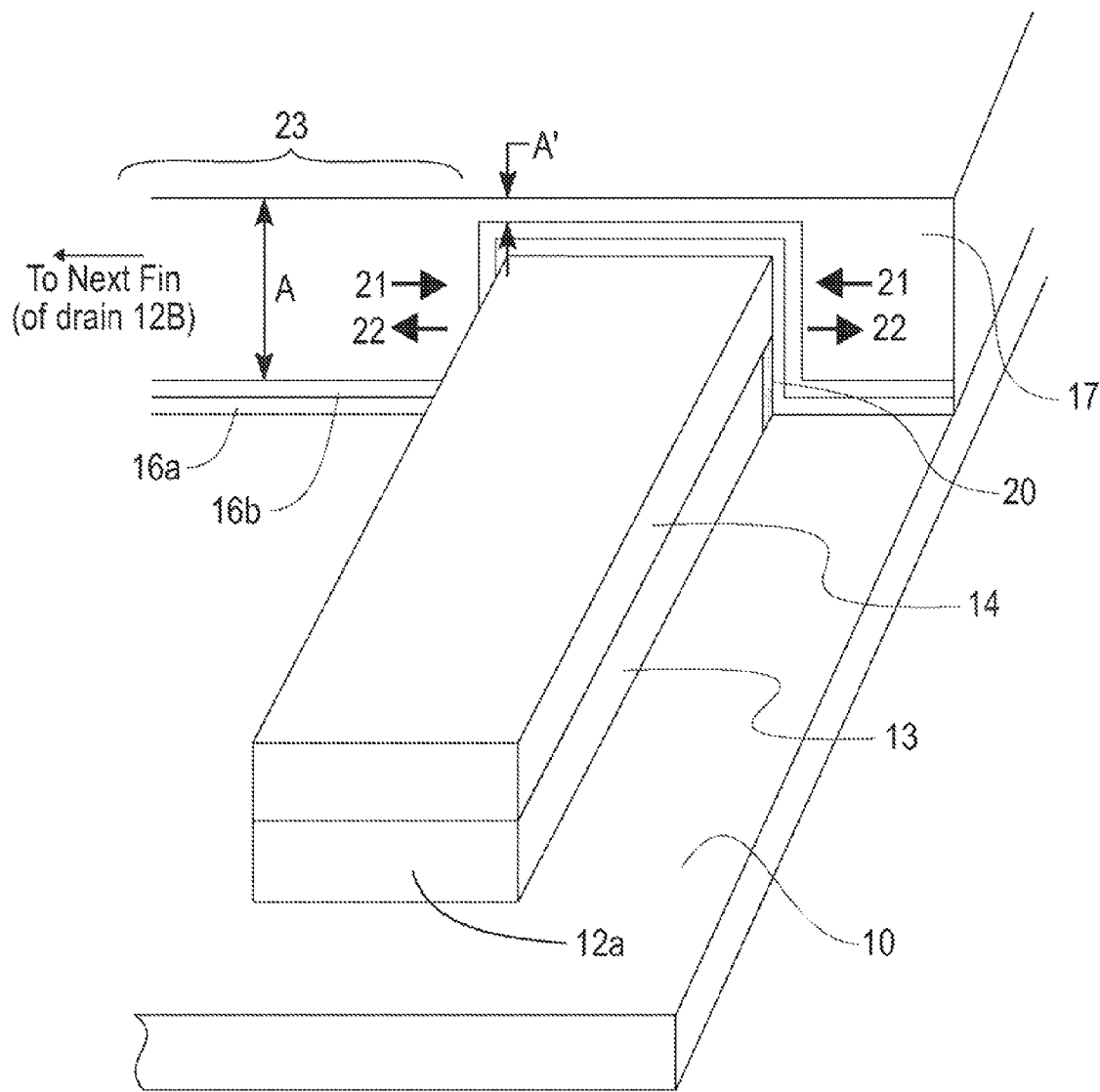
FIG. 2 is a perspective view illustrating structural details of the interface between the fin-shaped conductive region, the work-function metal layer, and the metal gate layer according to an exemplary embodiment of the present invention.

FIG. 2 is a perspective view illustrating structural details of the interface between the fin-shaped conductive region 13, the gate dielectric 16a, the work-function metal layer 16b, and the metal gate layer 17 according to an exemplary embodiment of the present invention. In this figure a first drain 12A can be seen. A second drain 12B is indicated as being located off of the figure to the left. The two drains correspond to two fin-shaped conductive channels 13 and corresponding hard masks 14. Between the conductive channels 13 is an inter-fin region 23 that may be free of voids according to exemplary embodiments of the present invention. A work-function metal layer 16b is illustrated as overlapping the hard mask 14 of the fin-shaped conductive channel 13 and directly over the gate dielectric 16a which in turn is over the substrate 10 in the inter-fin regions. The work-function metal layer 16b is illustrated as having a uniform thickness.

The thickness of the metal gate layer 17 is shown as having a largest thickness "A" in the inter-fin region 23 and having a smallest thickness "A'" in the region above the conductive channels 13 and the hard mask 14. The metal gate layer 17 is shown as having net volumetric expansion 21 to cast a compressive stress on the fin or a net volumetric compression 22 to cast a tensile stress on the fin, as described in detail above. As illustrated in the figure, exemplary embodiments of the present invention may stress engineer the metal gate layer 17 such that stress may be applied to the channel region from the sides rather than from above the channel region. Here, the stress film, which is embodied as the metal gate layer 17, may be formed by a subtractive process rather than an additive process.

A thin interface layer 20 may be formed between the conductive channel and the gate dielectric layer 16a. The interface layer 20 may be formed of an oxide such as silicon oxide. After the work-function metal layer 16b has been successfully formed over the gate dielectric 16a, however, the interface layer 20 may be removed to reduce the gap between the conductive channel 13 and the work-function metal layer 16b. The interface layer may be removed, for example, by using a gettering process by which oxygen is drawn out of the oxide that forms the interface layer 20.

Figure 3A:
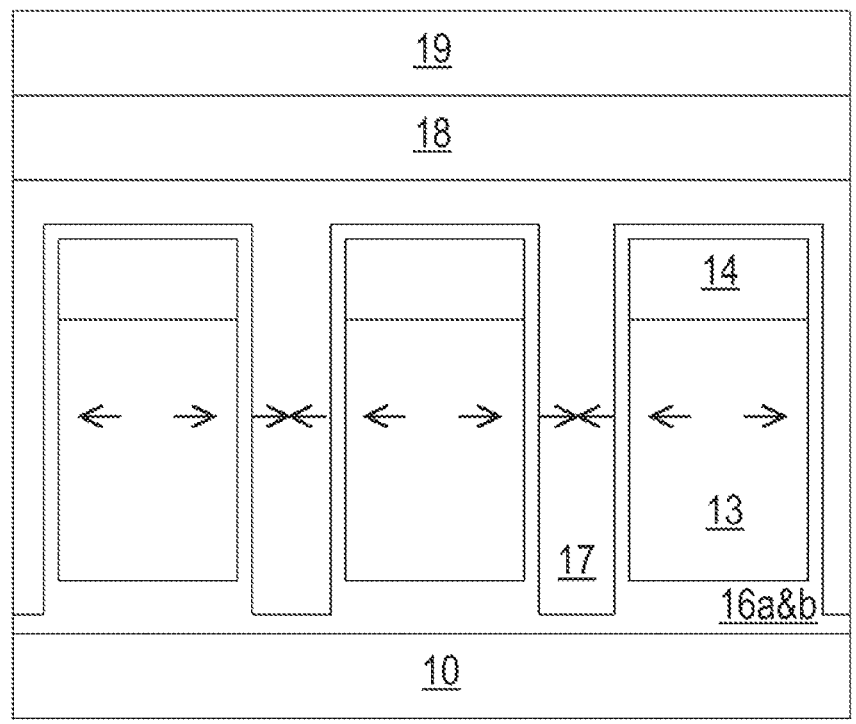
FIGS. 3A and 3B are side-views of a nonplanar multigate transistor according to an exemplary embodiment of the present invention.
Figure 3B:
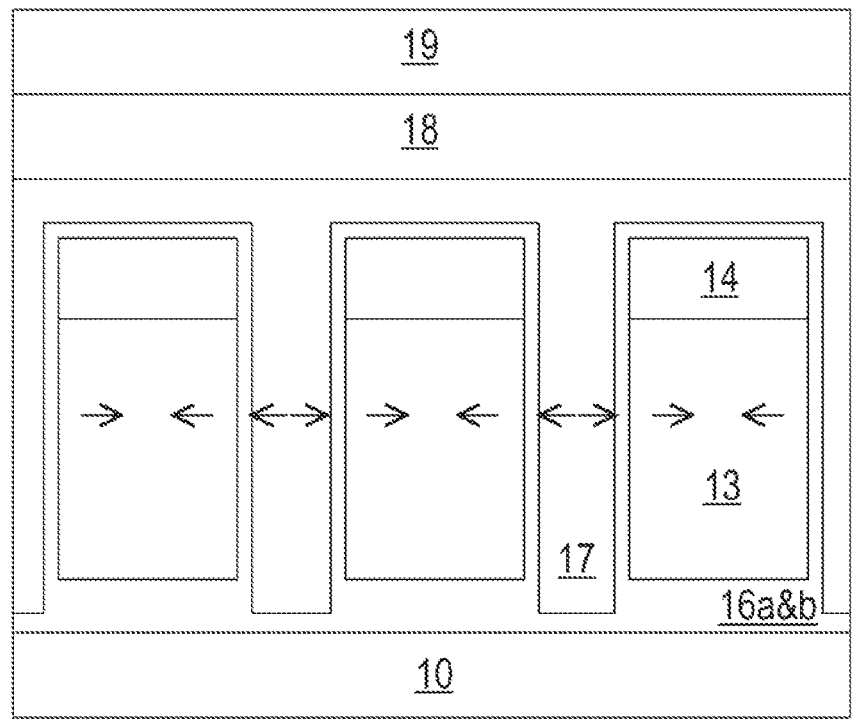

As described above, exemplary embodiments of the present invention may use stress engineering in the gate metal layer 17 to provide tensile or compressive stress on the conductive channel. This stress may be used to enhance the responsiveness of the field-effect transistor. FIGS. 3A and 3B are side-views of a nonplanar multigate transistor according to an exemplary embodiment of the present invention. In these figures, like reference numerals may be used to refer to similar elements as shown in previous figures. As shown in FIG. 3A, the gate stack films may be engineered to provide tensile stress in the gate metal layer 17. Tensile stress in the gate metal layer 17, as shown by the outwardly facing arrows, may provide compressive stress in the fin-shaped conductive channel 13 (as shown by the inwardly facing arrows thereof) in a direction perpendicular to the longitudinal axis of the channel (from source to drain). As shown in FIG. 3B, the gate stack films may be engineered to provide compressive stress in the gate metal layer 17. Compressive stress in the gate metal layer 17, as shown by the inwardly facing arrows, may provide tensile stress in the fin-shaped conductive channel 13 (as shown by the outwardly facing arrows thereof) in a direction perpendicular to the longitudinal axis of the channel (from source to drain).

Figure 4A:
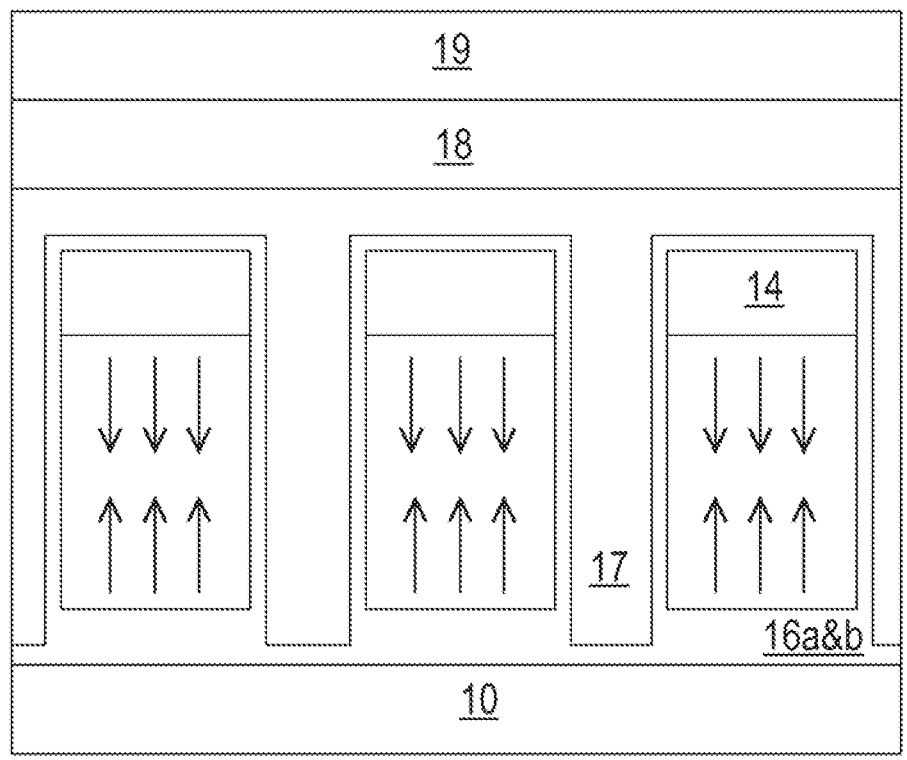
FIGS. 4A and 4B are side-views of a nonplanar multigate transistor according to an exemplary embodiment of the present invention.
Figure 4B:
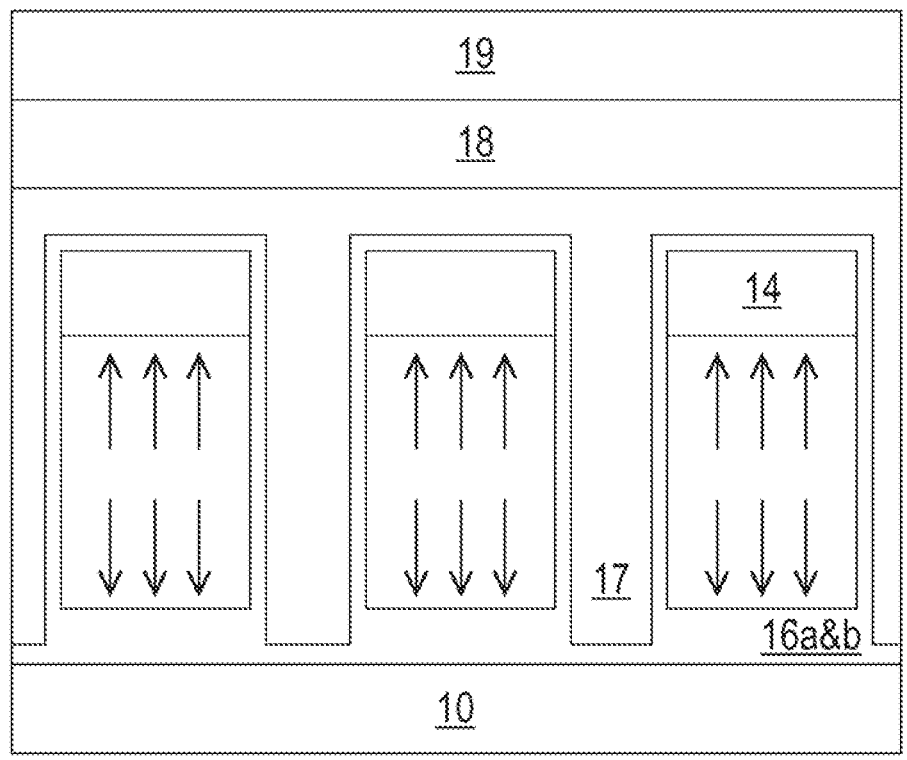

The gate stack films may also be stress engineered to provide tensile stress or compressive stress in the upward-facing direction of the fin. FIGS. 4A and 4B are side-views of a nonplanar multigate transistor according to an exemplary embodiment of the present invention. In these figures, like reference numerals may be used to refer to similar elements as shown in previous figures. As shown in FIGS. 4A and 4B, the work-function metal layer 16b may also be engineered to provide stresses in the fin-shaped conductive channel 13.

Here, the liner metal film may expand upon the anneal to impart tensile stress in the fin-height direction, for example, in cases where the Pilling-Bedworth (PB) ratio is greater than 1 (FIG. 4B). Conversely, where the PB ratio is less than 1, the linear film may contract upon the anneal and impart compressive stress in the fin-height direction, for example, in cases where the PB ratio is less than 1 (FIG. 4A).

Figure 5:
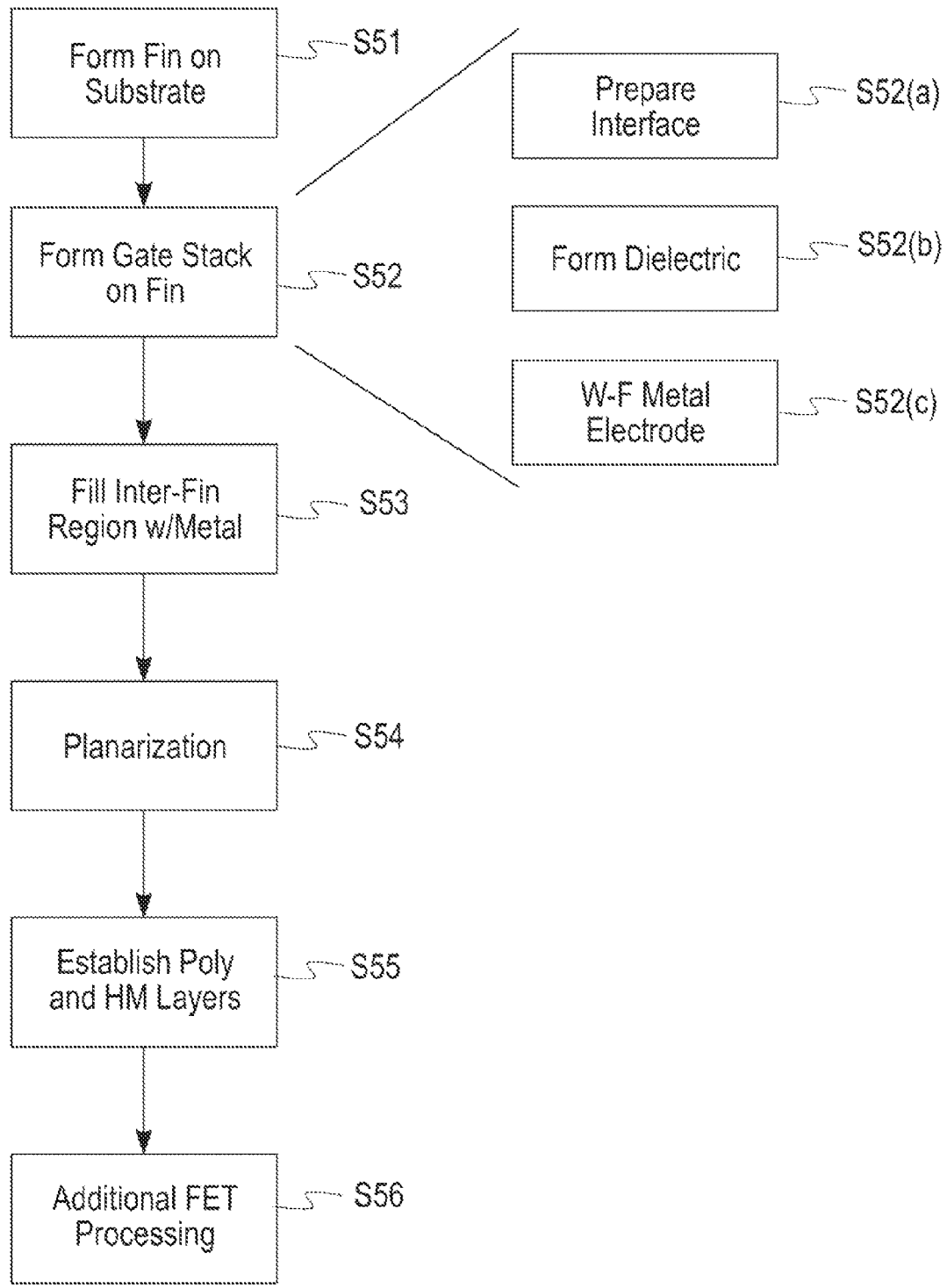
FIG. 5 is a flow chart illustrating a method for fabricating a nonplanar multigate transistor according to an exemplary embodiment of the present invention.

FIG. 5 is a flow chart illustrating a method for fabricating a nonplanar multigate transistor according to an exemplary embodiment of the present invention. A fin-shaped conductive channel may be formed on a substrate (Step S51). As discussed above, the substrate may be a semiconductor substrate such as SOI or bulk. The fin may be formed by direct lithography on the semiconductor surface and the fins may then be etched. Sidewall image transfer (SIT) may be used where sacrificial mandrel is formed over the semiconductor surface and a spacer is formed on the sacrificial layer that acts as an etch mask to pattern the fins on the semiconductor surface. The final conductive channel structure may be composed of the semiconductor fin having a width within the range of approximately 5-30 nm. Particularly, the fin may have a width within the range of approximately 9-15 nm. The height of the semiconductor fin may be within the range of approximately 15-60 nm. Particularly, the height of the semiconductor fin may be within the range of approximately 20-30 nm.

During spacer formation, the PC stack, including the fin, the interface layer, the gate dielectric, the work function metal, and the stress metal may be completely encapsulated by a dielectric.

As described above, the conductive channel structure may optionally include a hard mask. For example, the hard mask layer may be present in a FinFET device and absent from a tri-gate device. In either case, multiple fins may be so formed.

Next, a gate stack may be formed over the fins (Step S52). To form the gate stack, an interface preparation may be performed before gate dielectric formation and/or deposition (Step S52a). The thickness of the resulting interface layer may be approximately 1 nm. One or more high-k dielectrics may then be deposited or grown on the interface layer (Step S52b). The high-k dielectric layer may be within the range of approximately 1-10 nm thick. Particularly, the high-k dielectric layer may be within the range of approximately 1.5-3 nm thick. A work-function metal electrode may then be deposited on the dielectric (Step S52c). The thickness of the work-function metal electrode may be within the range of approximately 1-20 nm. Particularly, the thickness of the work-function metal electrode may be within the range of approximately 2-5 nm. The work-function metal electrode may be stress engineered to induce stress onto the fins, for example, as shown in FIGS. 4A and 4B. The work-function metal may include one or more of TiN, TaN, TaAlN, TaC, TaCN, TiAlN, TiAl, other conductive refractory metal nitride, or an alloy thereof However, other metals may be used to achieve the desired electrical and mechanical properties. For example, desired electrical properties may include work function and scalability while desired mechanical properties may include PB ratio, differential co-efficient of expansion or contraction.

Next, the inter-fin region may be filled with metal (Step S53). As described above, this metal gate layer 17 may be stress engineered, for example, based on the PB ratio as shown in FIGS. 3A and 3B. The metal gate layer may be made of one or more of Al, W, WN, TiN, TaN, TaAlN, TaC, TaCN, TiAlN, and TiAl and alloys thereof. The particular metals used for the metal gate layer and/or the work-function metal electrode may be selected to impart the optimal stress on the channel of the device and to reduce T-inversion (Tinv) by gettering the interface layer. The reduced Tinv may also enhance transistor performance. Accordingly, by filling the inter-fin region with metal, voids may be reduced or eliminated and tighter integration and reduced fin-to-fin pitch may be achieved.

The metal gate layer 17 may be sufficiently thick to completely fill the inter-fin region up to the height of the top of the fin-shaped conductive region 13 and/or the hard mark 14, where it is present. The metal gate layer 17 may also rise above the inter-fin region. For example, the metal gate layer 17 may rise 0-50 nm above the top of the fin-shaped conductive region 13 and/or the hard mark 14, where it is present. Particularly, the metal gate layer 17 may rise 10-30 nm above the top of the fin-shaped conductive region 13 and/or the hard mark 14, where it is present.

As described above, different fill metals may be used to impart stress on nFET and pFET devices. Also the stress can be tuned based on the type of device such as logic, SRAM, IO device etc. The metal species and the deposition technique can be used to tune the desired electrical and mechanical properties. Examples of tunable electrical properties include resistivity and scalability while examples of tunable mechanical properties include PB ratio, differential co-efficient of expansion, and contraction properties.

Next, the formed gate metal layer may be planarized (Step S54). Planarization of the gate metal layer may, for example, be performed by chemical mechanical polishing (CMP).

Then, deposition of either direct hard mask (HM) or poly-silicon followed by HM deposition may be performed (Step S55) to establish the optional poly-silicon layer 18 and the HM layer 19, for example, as described in detail above. The thickness of the optional poly-silicon layer 18 may be within the range of approximately 0-50 nm. It should be noted that while this layer 18 is identified as a poly-silicon layer, the layer 18 may alternatively or additionally include amorphous silicon or another suitable materials.

Additional FET processing steps may be performed (Step S56). Additional FET processing may include, for example, gate lithography and etch followed by spacer/junction formation. After spacer formation, the fins may be optionally merged in the source drain regions.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A non-planar semiconductor transistor device, comprising:
   a substrate layer;
   a plurality of source and drain electrodes on the substrate layer, with a plurality of corresponding conductive channels extending between corresponding source and drain electrodes; and
   a gate stack on the substrate layer, crossing over the plurality of conductive channels, the gate stack extending in a direction perpendicular to the direction in which the conductive channels extend, the gate stack comprising:

a dielectric layer running along the substrate and the plurality of conductive channels and arranged with a substantially uniform layer thickness;

a work-function electrode layer covering the dielectric layer and arranged with a substantially uniform layer thickness;

a metal layer, distinct from the work-function electrode layer, covering the work-function electrode layer and arranged with a substantially uniform height with respect to the substrate such that the metal layer fills a gap between proximate conductive channels of the plurality of conductive channels; and a barrier layer disposed between the metal layer and the work-function electrode layer, the barrier layer configure to getter an interface layer and reduce a distance between the work-function electrode layer and the conductive channels, wherein the metal layer of the gate stack is stress-engineered to have an intrinsic state of compressive or tensile stress to provide compressive or tensile stress to the conductive channels.

2. The device of claim 1, wherein each conductive channel of the plurality of conductive channels comprises a conductive layer and a hard mask layer on top of the conductive layer.

3. The device of claim 1, wherein the non-planar semiconductor transistor device is a FinFET device.

4. The device of claim 1, wherein the work-function electrode layer and the metal layer are of a different chemical composition or alloy.

5. The device of claim 1, wherein the work-function electrode layer conforms to the shape of the top surface of the channels.

6. The device of claim 1, wherein the metal layer is planarized by a polishing process after deposition.

7. The device of claim 1, wherein the interface layer is located between the conductive channels and the gate dielectric.

8. The device of claim 1, wherein the conductive channel is formed of silicon, germanium, SiGe or SiC.

9. The device of claim 1, wherein the dielectric layer is formed of a semiconductor oxide or high-K dielectric film having a high dielectric constant greater than 3.9.

10. The device of claim 1, wherein the dielectric layer has a thickness of between approximately 1 nm and approximately 10 nm.

11. The device of claim 1, wherein the work-function layer is formed of a metal or another conductive material having a desired work function that permits a desired level of electron removal from the conductive channel, wherein the desired work function is within the range of 3.0 eV and 6.0 eV.

12. The device of claim 1, wherein the work-function layer is formed of TaN, TiN, WN, TiAlN, TaCN, another conductive refractory metal nitride, or an alloy thereof.

13. The device of claim 1, wherein the metal layer is formed over the work-function layer by sputtering, physical vapor deposition, atomic layer deposition or chemical vapor deposition.

14. The device of claim 1, wherein the metal layer comprises tungsten, tungsten nitride, or a tungsten aluminum alloy.

15. The device of claim 1, wherein the thickness of the work-function layer is between approximately 1 nm and 20 nm.

16. A non-planar semiconductor transistor device, comprising:

a substrate layer;

a plurality of source and drain electrodes on the substrate layer, with a plurality of corresponding conductive channels extending between corresponding source and drain electrodes;

a gate stack on the substrate layer, crossing over the plurality of conductive channels, the gate stack extending in a direction perpendicular to the direction in which the conductive channels extend, the gate stack comprising:

a dielectric layer running along the substrate and the plurality of conductive channels and arranged with a substantially uniform layer thickness;

a work-function electrode layer covering the dielectric layer and arranged with a substantially uniform layer thickness; and a metal layer, distinct from the work-function electrode layer, covering the work-function electrode layer and arranged with a substantially uniform height with respect to the substrate such that the metal layer fills a gap between proximate conductive channels of the plurality of conductive channels, wherein the metal layer is stress-engineered to have an intrinsic state of compressive or tensile stress;

an interface layer located between the conductive channels and the gate dielectric; and a barrier layer located between the metal layer and the work-function layer that getters the interface layer and reduces the distance of the work-function electrode layer from the conductive channels.

17. The device of claim 16, wherein each conductive channel of the plurality of conductive channels comprises a conductive layer and a hard mask layer on top of the conductive layer.

18. The device of claim 16, wherein the non-planar semiconductor transistor device is a FinFET device.

19. The device of claim 16, wherein the work-function electrode layer and the metal layer are of a different chemical composition or alloy.

20. The device of claim 16, wherein the work-function electrode layer conforms to the shape of the top surface of the channels.

21. The device of claim 16, wherein the metal layer is planarized by a polishing process after deposition.

22. The device of claim 16, wherein the metal layer is formed over the work-function layer by sputtering, physical vapor deposition, atomic layer deposition or chemical vapor deposition.

23. The device of claim 16, wherein the metal layer comprises tungsten, tungsten nitride, or a tungsten aluminum alloy.

* * * * *